United States Patent
Annapragada et al.

(10) Patent No.: US 7,081,407 B2
(45) Date of Patent: Jul. 25, 2006

(54) METHOD OF PREVENTING DAMAGE TO POROUS LOW-K MATERIALS DURING RESIST STRIPPING

(75) Inventors: Rao Annapragada, Union City, CA (US); Kenji Takeshita, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/738,280

(22) Filed: Dec. 16, 2003

(65) Prior Publication Data
US 2005/0130435 A1    Jun. 16, 2005

(51) Int. Cl.
*H01L 231/4763* (2006.01)

(52) U.S. Cl. ............... 438/624; 257/E21.584

(58) Field of Classification Search .......... 438/82, 438/197, 201, 212, 219, 248, 257, 269–270, 438/295–296, 424, 618, 780
See application file for complete search history.

(56) References Cited

U.S. PATENT DOCUMENTS

| | | | |
|---|---|---|---|
| 6,071,822 A | 6/2000 | Donohue et al. | 438/712 |
| 6,100,200 A | 8/2000 | Van Buskirk et al. | 438/697 |
| 6,114,259 A * | 9/2000 | Sukharev et al. | 438/789 |
| 6,150,272 A * | 11/2000 | Liu et al. | 438/692 |
| 6,235,453 B1 * | 5/2001 | You et al. | 430/329 |
| 6,413,877 B1 | 7/2002 | Annapragada | 438/723 |
| 6,632,903 B1 | 10/2003 | Jung et al. | 526/269 |
| 6,673,721 B1 * | 1/2004 | Kim et al. | 438/725 |
| 6,686,271 B1 * | 2/2004 | Raaijmakers et al. | 438/633 |
| 6,734,096 B1 * | 5/2004 | Dalton et al. | 438/624 |
| 6,800,558 B1 * | 10/2004 | Chang et al. | 438/700 |
| 6,805,139 B1 * | 10/2004 | Savas et al. | 134/1.3 |
| 2002/0076935 A1 * | 6/2002 | Maex et al. | 438/706 |
| 2003/0207594 A1 * | 11/2003 | Catabay et al. | 438/778 |
| 2004/0063330 A1 * | 4/2004 | Crawford | 438/712 |
| 2004/0072430 A1 * | 4/2004 | Huang et al. | 438/689 |
| 2004/0149686 A1 * | 8/2004 | Zhang et al. | 216/37 |
| 2004/0180269 A1 * | 9/2004 | Balasubramaniam et al. | 430/5 |

OTHER PUBLICATIONS

International Search Report dated Dec. 14, 2005.

* cited by examiner

*Primary Examiner*—David A. Zarneke
(74) *Attorney, Agent, or Firm*—Beyer Weaver & Thomas LLP

(57) ABSTRACT

A method of forming a feature in a porous low-K dielectric layer is provided. A porous low-K dielectric layer is placed over a substrate. A patterned photoresist mask is placed over the porous low-K dielectric layer. A feature is etched into the porous low-K dielectric layer. A protective layer is deposited over the feature after the etching the feature. The patterned photoresist mask is stripped, so that part of the protective layer is removed, where protective walls formed from the protective layer remain in the feature.

16 Claims, 5 Drawing Sheets

METHOD OF PREVENTING DAMAGE TO POROUS LOW-K MATERIALS DURING RESIST STRIPPING

BACKGROUND OF THE INVENTION

The present invention relates to the fabrication of semiconductor-based devices. More particularly, the present invention relates to improved techniques for fabricating semiconductor-based devices with porous low-k dielectric layers.

In semiconductor-based device (e.g., integrated circuits or flat panel displays) manufacturing, dual damascene structures may be used in conjunction with copper conductor material to reduce the RC delays associated with signal propagation in aluminum based materials used in previous generation technologies. In dual damascene, instead of etching the conductor material, vias, and trenches may be etched into the dielectric material and filled with copper. The excess copper may be removed by chemical mechanical polishing (CMP) leaving copper lines connected by vias for signal transmission. To reduce the RC delays even further, porous low dielectric constant materials may be used. These porous low dielectric constant materials may include porous organo-silicate-glass (OSG) materials. OSG materials may be silicon dioxide doped with organic components such as methyl groups. OSG materials have carbon and hydrogen atoms incorporated into a silicon dioxide lattice, which lowers the dielectric constant of the material. However OSG materials may be susceptible to damage when exposed to $O_2$, $H_2$, and $NH_3$ gases, which are used for stripping photo resist. Porous material has pores, which allow stripping plasmas to reach deeper into the layer causing greater damage.

Porous OSG materials may be very susceptible to damage due to the removal of organic content by exposure to the plasma used to strip the resist and sidewalls. The plasma may diffuse into the pores of the porous OSG layer and cause damage as far as 300 nm into the OSG layer bordering the opening. Part of the damage caused by the plasma is the removal of carbon and hydrogen from the damage area causing the OSG to be more like silicon dioxide, which has a higher dielectric constant. Damage may be quantified by measuring the change in SiC/SiO ratio of the OSG layer from FTIR analysis. When translated to the trench side wall that means a damage of a few hundred angstroms on each side of a 2000 Å trench wall.

It is desirable to reduce damage to porous low-k dielectric layers during the stripping process.

SUMMARY OF THE INVENTION

To achieve the foregoing and other objects and in accordance with the purpose of the present invention a method of forming a feature in a porous low-K dielectric layer is provided. A porous low-K dielectric layer is placed over a substrate. A patterned photoresist mask is placed over the porous low-K dielectric layer. A feature is etched into the porous low-K dielectric layer. A protective layer is deposited over the feature after the etching the feature. The patterned photoresist mask is stripped, so that part of the protective layer is removed, where small part of the protective walls formed from the protective layer remain in the feature.

In another manifestation of the invention, an apparatus for etching a feature in a porous low-K dielectric layer through a mask over a substrate is provided. A plasma processing chamber is provided, comprising a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet. A controller is controllably connected to at least one of the gas source the at least one electrode, the pressure regulator, the gas inlet, and the gas outlet. The controller comprises at least one processor and computer readable media. The computer readable media comprises computer readable code for providing an etch plasma for etching a feature into a porous low-K dielectric layer, computer readable code for providing a deposition plasma for forming a protective layer over the feature after the feature has been etched, and computer readable code for stripping a photoresist mask from over the porous low-K dielectric layer, where the stripping removes part of the protective layer and leaves small protective walls formed from the protective layer.

In another manifestation of the invention a method of forming a feature in a porous low-K dielectric layer over a substrate and disposed below a patterned photoresist mask is provided. A feature is etched into the porous low-K dielectric layer through the photoresist mask. A protective layer is deposited over the feature after the etching the feature. The patterned photoresist mask is stripped, so that part of the protective layer is removed, where protective walls formed from the protective layer remain in the feature.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
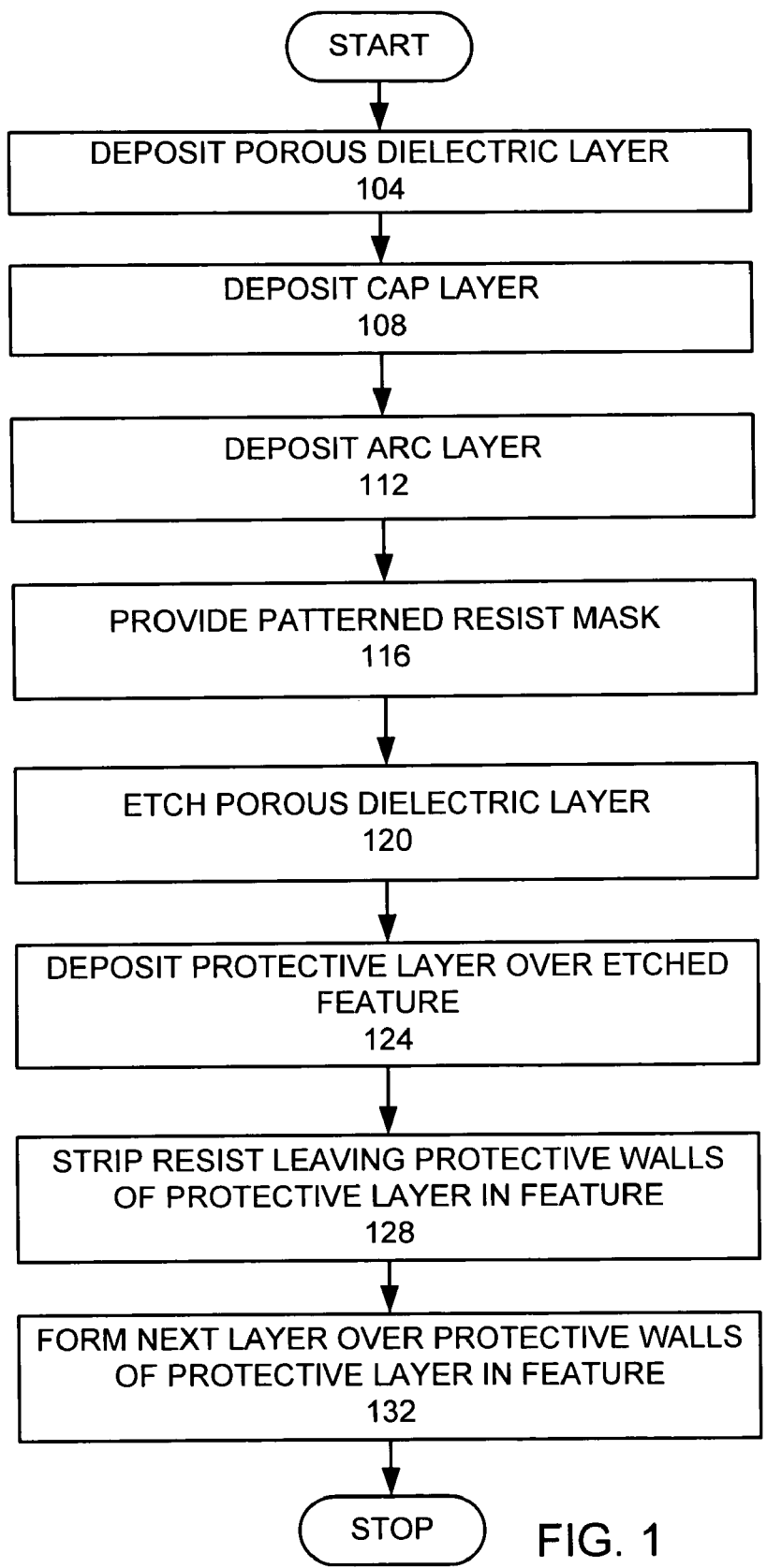
FIG. 1 is a flow chart of a process used in an embodiment of the invention.
Figure 2A:
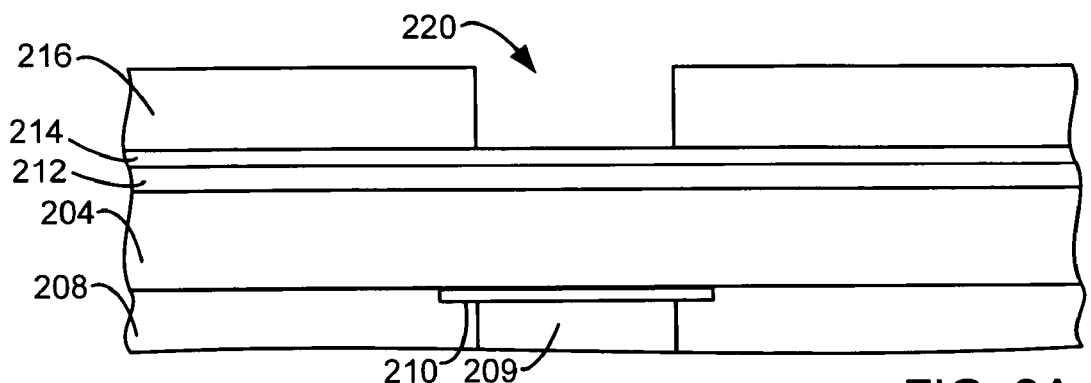
FIGS. 2A–F are schematic side views of an etched porous low-K dielectric layer according to the process of FIG. 1.

To facilitate discussion, FIG. 1 is a flow chart of an etching process of porous low-k dielectric layer used in a preferred embodiment of the invention. Where the pores are nanometer sized pores. More preferably, the pores are from about 1 nm to about 10 nm. In the definition and claims, the phrase porous low-k dielectric is a dielectric with a dielectric constant of less than 2.3, since dielectric materials with a dielectric constant of less than 2.3 are usually porous. Some examples of porous low-k dielectric materials are JSR LKD-5109 Low-K dielectric, made by JSR Corporation of Tokyo, Japan and Zirkon™ LK made by Shipley Microelectronics, which is a subsidiary of Rohm and Haas of Philadelphia, Pa. Some porous low-K dielectric materials are based on organosilicate glass (OSG). Other porous low-K dielectric material are porous SILK, a purely organic material, which is silicon free. FIGS. 2A–D are schematic side views of a porous low-k dielectric layer according to the process of FIG. 1. A porous dielectric layer 204 may be deposited on a substrate 208 (step 104), as shown in FIG. 2A. The substrate 208 may be a silicon wafer or another type of material or may be part of a layer over a wafer. A cap layer 212 is formed over the porous dielectric layer 204 (step 108). The cap layer 212 may be silicon oxide. Generally, the cap layer is a protective layer of a dielectric material. The cap layer 212 protects the porous dielectric layer 204 during chemical mechanical polishing (CMP) and other processes. The cap layer 212 may be a low-k dielectric, since the cap layer is part of the end product. Preferably, the cap layer is of a silicon oxide base material. The cap layer is preferably has a thickness of between about 200 Å and about 1000 Å. An antireflective coating (ARC) 214 is deposited over the cap layer 212 (step 112). The antireflective coating (ARC) 214 may be an organic bottom antireflective coating (BARC) or an inorganic dielectric antireflective coating (DARC). The ARC has a thickness between about 100 Å and about 1000 Å. A patterned resist mask 216 is provided over the ARC 214 (step 116). The patterned resist mask 216 has an aperture 220. The patterned resist mask may be formed by placing a layer of photoresist, which is exposed to a light pattern and then etched. Other methods of forming a patterned resist mask may be used. The substrate 208 may have a contact 209 and a barrier layer 210.

Figure 2B:
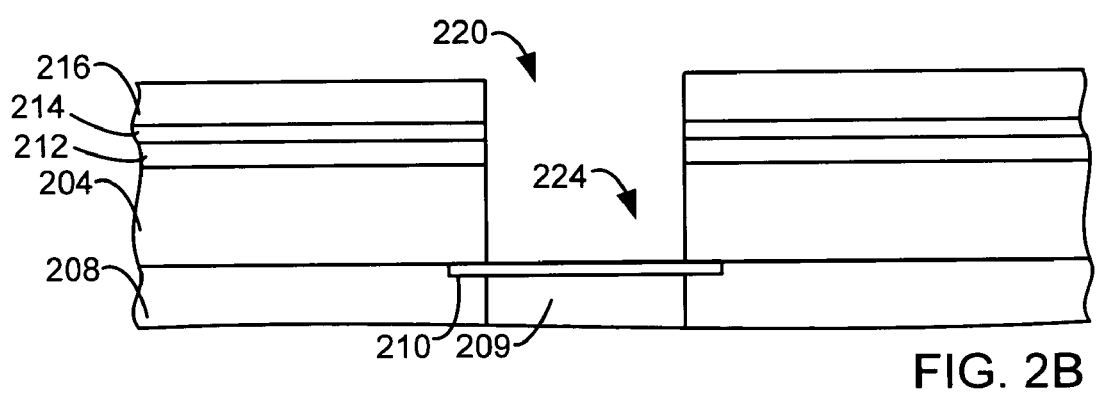

The substrate 208 may be placed in an etching chamber where the porous dielectric layer 204 is etched (step 120). A plasma dry etch may be used to etch the porous dielectric layer 204, which forms an opening 224 under the aperture 220 in the patterned resist mask 216, as shown in FIG. 2B. Some of the patterned resist mask 216 is removed during the porous dielectric layer etch. Such porous dielectric etches may use a chemical etch, such as using a fluorine based etchant. For example, an etch chemistry may use $C_4F_8$ and $N_2$ at low pressure. As a result, the sidewalls of the feature may be etched. In addition, such etches may deposit polymer during the etch. Such etches may use some $O_2$, but the amount of $O_2$ would generally be less than the amount of $O_2$ used in the stripping process. Since the amount of $O_2$ is small and the pressure is kept low, the etch chemistry does not damage the porous dielectric, as much as a stripping process would.

Figure 2C:
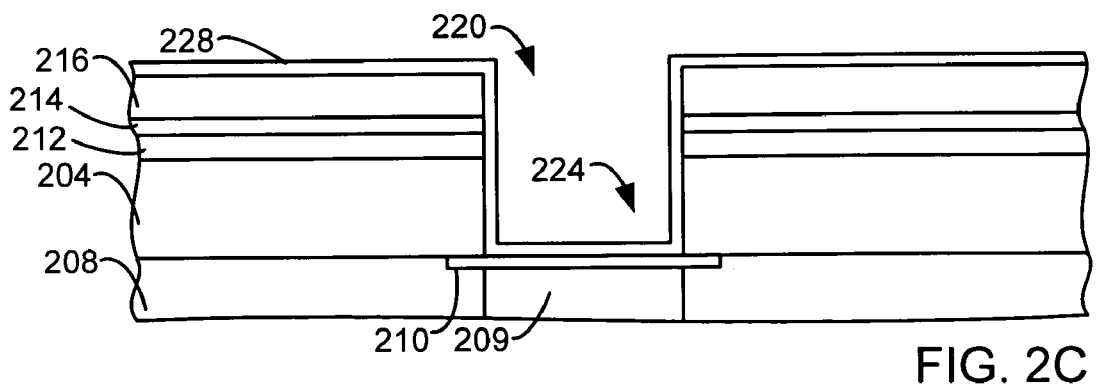

A protective layer 228 is then deposited over the etched feature (step 124), as shown in FIG. 2C. In a preferred embodiment, the protective layer is formed by a polymer deposition. Such a polymer deposition chemistry may use a deposition chemistry of $C_2H_4$ and $N_2$ or $CH_4$ and $O_2$. To avoid damaging the exposed porous dielectric, it is preferred that a fluorine free chemistry is used for polymer formation. Preferably, the thickness of the polymer deposition is between about 100 and 1500 Å. More preferably, the thickness of the polymer deposition is between about 200 and 800 Å. Most preferably, the thickness of the polymer deposition is between about 200 and 500 Å.

Figure 2D:
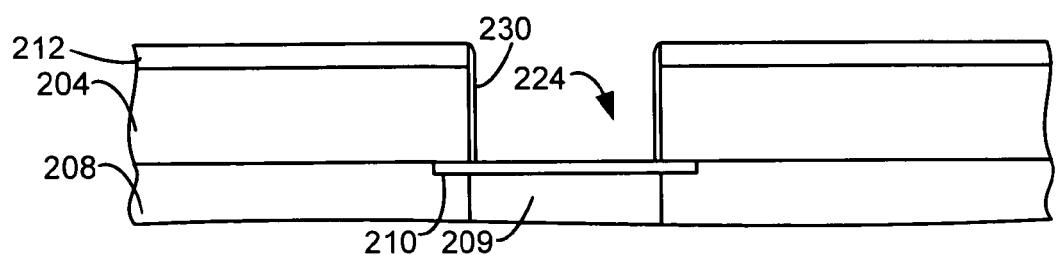

The patterned resist mask 216 is stripped using a stripping that also removes part of the protective layer, leaving protective walls 230 of the protective layer in the feature 224 to protect the porous dielectric (step 128), as shown in FIG. 2D. Typical photoresist strip chemistries use $O_2$, $NH_3$, or $N_2H_2$ based stripping chemistries. These stripping chemistries are able to diffuse through the pores cause the damage to organic components of the porous low-k dielectric deep below the exposed surface, causing damage to a substantial portion of the low-k dielectric. However, the protective walls 230 provide protection of the porous dielectric layer 204 so that there are no exposed surfaces of the porous dielectric layer during the stripping process. The protective walls 230 are thin enough to avoid adhesion failure. If the protective walls are too thick, they may delaminate causing adhesion problems. On the other hand, if the original protective layer is too thin, then there would be insufficient protection of the porous dielectric layer. Generally, sidewalls that may form as a result of the etch step are too thin to provide sufficient protection of the porous dielectric layer, which is why a polymer deposition step after etching is completed is needed. Preferably, ion bombardment is used during the strip, to preferentially remove top surfaces of the protective layer without removing the protective walls.

Figure 2E:
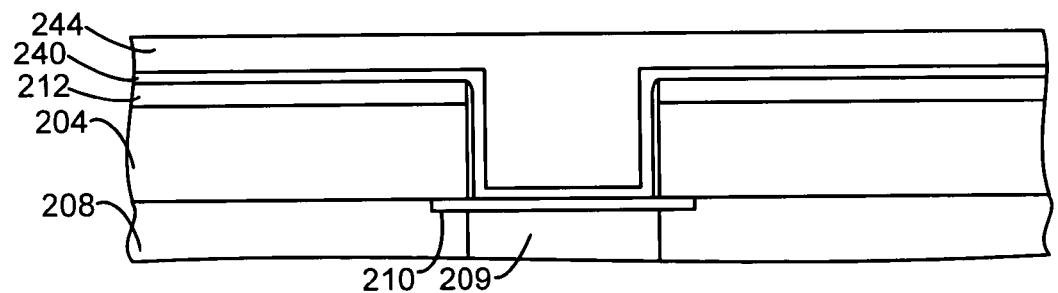
Figure 2F:
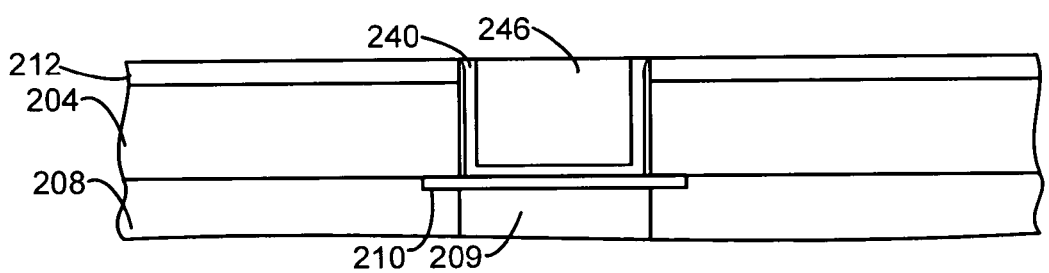

In some embodiments of the invention, the barrier layer 210 may be opened after the photoresist 216 is stripped. The protective walls 230 may further protect the porous dielectric layer during the opening of the barrier layer 210. A next layer is then formed over the protective walls 230 (step 132). In one example, a barrier layer 240 is formed over the protective walls 230, as shown in FIG. 2E, and a copper contact layer 244 is formed in and over the feature. Chemical mechanical polishing is used to remove excess parts of the barrier layer 240 and copper contact layer 244 to form a copper 246, as shown in FIG. 2F.

Figure 3:
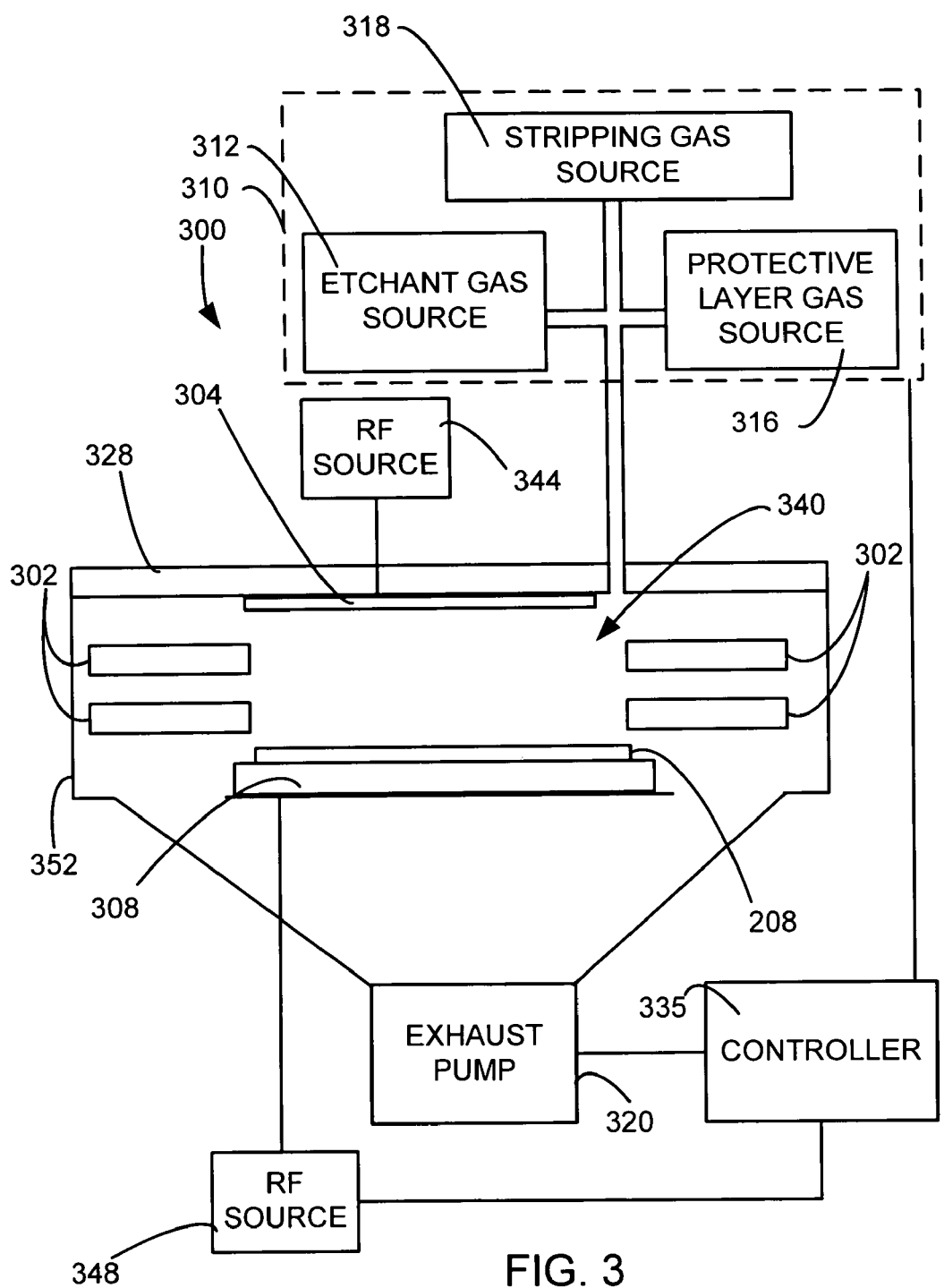
FIG. 3 is a schematic view of a process chamber that may be used in an embodiment of the invention.

FIG. 3 is a schematic view of a plasma processing chamber 300 that may be used for etching the feature, and then depositing the protective layer, and then stripping the photoresist in situ. The plasma processing chamber 300 comprises confinement rings 302, an upper electrode 304, a lower electrode 308, a gas source 310, and an exhaust pump 320. The gas source 310 comprises an etchant gas source 312, a protective layer gas source 316, and a stripping gas source 318. The gas source 310 may comprise additional gas sources. Within plasma processing chamber 300, the substrate 208 is positioned upon the lower electrode 308. The lower electrode 308 incorporates a suitable substrate chucking mechanism (e.g., electrostatic, mechanical clamping, or the like) for holding the substrate 208. The reactor top 328 incorporates the upper electrode 304 disposed immediately opposite the lower electrode 308. The upper electrode 304, lower electrode 308, and confinement rings 302 define the confined plasma volume. Gas is supplied to the confined plasma volume by the gas source 310 and is exhausted from the confined plasma volume through the confinement rings 302 and an exhaust port by the exhaust pump 320. A first RF source 344 is electrically connected to the upper electrode 304. A second RF source 348 is electrically connected to the lower electrode 308. Chamber walls 352 surround the confinement rings 302, the upper electrode 304, and the lower electrode 308. Both the first RF source 344 and the second RF source 348 may comprise a 27 MHz power source and a 2 MHz power source. Different combinations of connecting RF power to the electrode are possible. An Exelan 2300™, which is made by LAM Research Corporation™ of Fremont, Calif., may be used in a preferred embodiment of the invention.

Figure 4A:
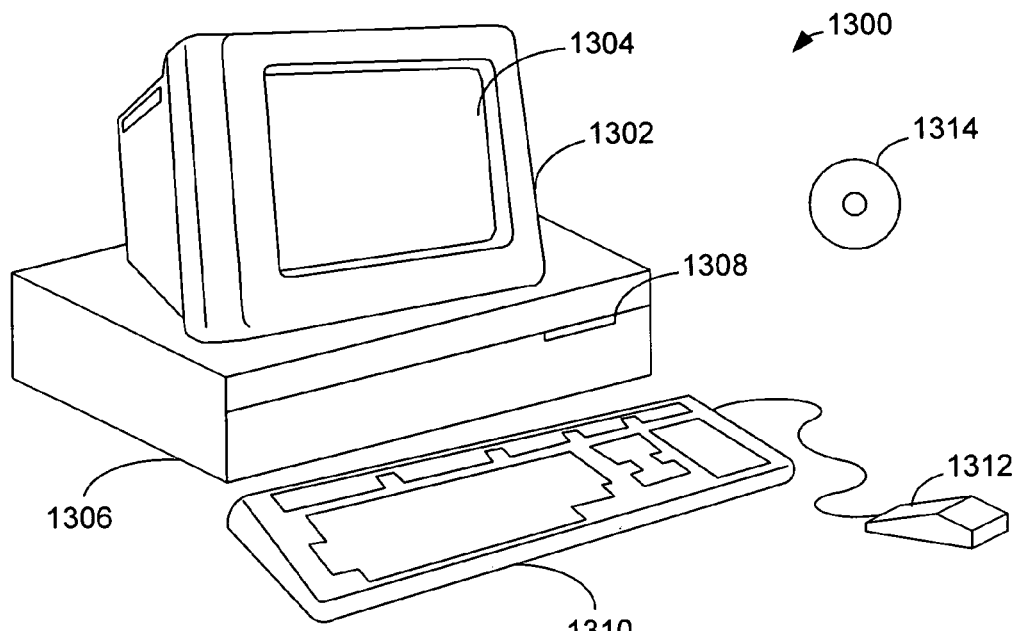
FIGS. 4A–B are schematic views of a computer system that may be used as a controller.
Figure 4B:
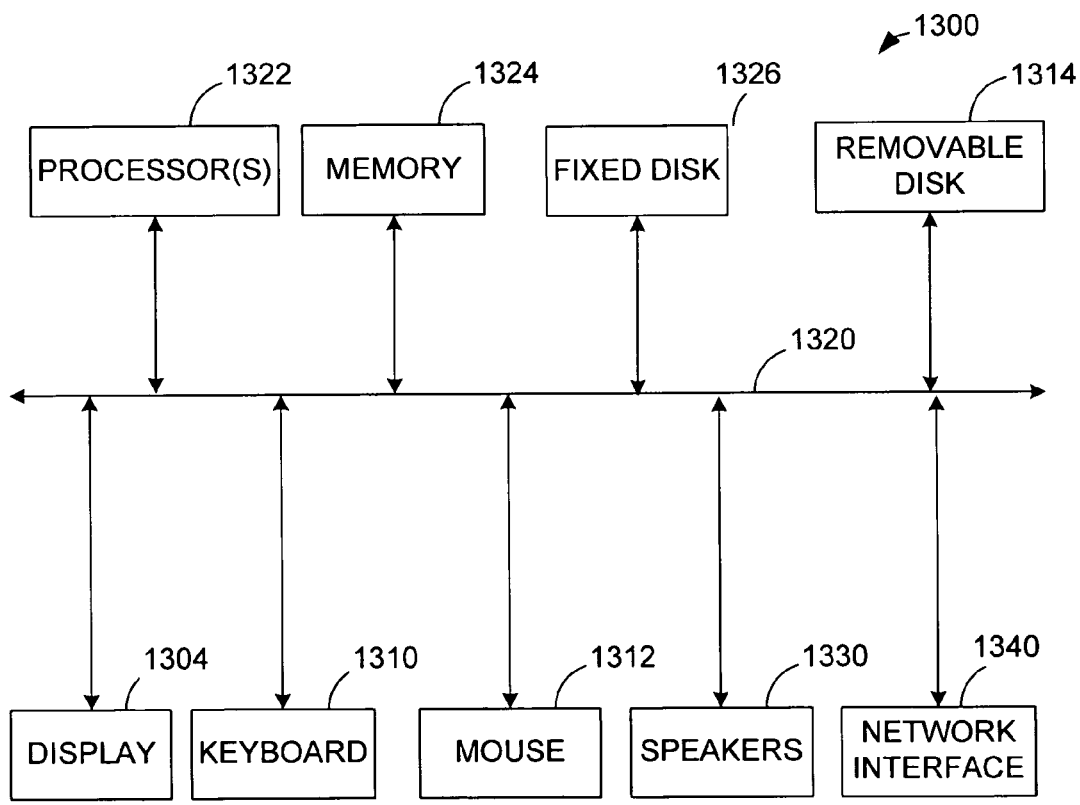

FIGS. 4A and 4B illustrate a computer system 1300, which is suitable for implementing a controller 335 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 4B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312 and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Other examples may use other deposition devices. In other embodiments a special etch may be used to remove the protective walls 230 without damaging the porous dielectric layer 204. In addition, other embodiments may perform the etching, depositing a protective layer, and stripping in separate chambers (ex situ).

Although the etching of a trench is illustrated above, the invention may also be used for etching a via or a trench after a via has been etched or etching a via after a trench has first been etched. After each feature is etched, a protective layer may be formed over the feature before the photoresist is stripped. In some cases, the next layer deposited over the protective walls may be a photoresist mask.

EXAMPLE

In an example of the invention, a porous dielectric layer of JSR LKD-5109 is spun onto a substrate. A silicon oxide cap layer is deposited onto the porous dielectric layer. The cap layer is about 500 Å thick. An organic ARC layer is formed over the cap layer. A patterned photoresist mask is formed over the ARC. In this example, the photoresist is 193 nm PR from Shipley.

The substrate is then placed in a Exelan 2300 dielectric etcher. A feature is etched through the ARC layer and the porous dielectric layer. An etch chemistry of 10 sccm of $C_4F_8$, and 12 sccm of $O_2$ is used to etch through the porous dielectric layer. The chamber pressure is set to about 120 mTorr. 1,000 W are provided by the 27 MHz RF source. 1,000 W are provided by the 2 MHz RF source.

After the feature is complete etched, a protective layer is deposited over the feature. This is done in situ. A deposition gas chemistry of 50 sccm of $C_2H_4$ and 5 sccm of $O_2$ is used to form a polymer deposition on the feature. The chamber pressure is set to about 120 mTorr. 500 W are provided by the 27 MHz RF source. 500 W are provided by the 2 MHz RF source. The deposition lasts for 15 seconds, to provide a deposition layer of about 300 Å thick.

After the protective layer is deposited, the photoresist mask is stripped. This is done in situ. A stripping gas chemistry of 600 sccm of $H_2$ and 200 sccm of $N_2$ is used to strip the photoresist mask. The chamber pressure is set to about 300 mTorr. 400 W are provided by the 27 MHz RF source. 400 W are provided by the 2 MHz RF source.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, modifications and various substitute equivalents as fall within the true spirit and scope of the present invention.

What is claimed is:

1. A method of forming a feature in a porous low-K dielectric layer, comprising:

placing a porous low-K dielectric layer over a substrate;

placing a patterned photoresist mask over the porous low-K dielectric layer;

etching a feature into the porous low-K dielectric layer;

depositing a protective layer over the feature after the etching the feature; and stripping the patterned photoresist mask, so that part of the protective layer is removed, where protective walls formed from the protective layer remain in the feature.

2. The method, as recited in claim 1, further comprising placing a cap layer over the porous low-K dielectric layer before placing the photoresist mask, wherein the photoresist mask is placed over the cap layer.

3. The method, as recited in claim 2, further comprising depositing a deposition layer over the protective walls.

4. The method, as recited in claim 3, further comprising forming an antireflective coating over the cap layer before placing the photoresist mask, wherein the photoresist mask is placed over the antireflective coating.

5. The method, as recited in claim 1, wherein the depositing the protective layer comprises depositing a fluorine free layer.

6. The method, as recited in claim 1, wherein the depositing the protective layer further comprises depositing a polymer layer.

7. The method, as recited in claim 6, wherein the protective layer is between 100 Å to 1500 Å thick.

8. The method, as recited in claim 7, wherein the depositing the polymer layer comprises providing deposition gases of $C_2H_4$ and $O_2$.

9. The method, as recited in claim 7, wherein the stripping comprises providing a stripping gas selected from at least one of hydrogen, nitrogen, ammonia and oxygen.

10. The method, as recited in claim 1, wherein the porous low-K dielectric layer comprises nanometer size pores.

11. The method, as recited in claim 1, wherein the stripping comprises using ion bombardment.

12. The method, as recited in claim 11, wherein the ion bombardment removes top layers of the protective layer, but leaves protective sidewalls formed by the protective layer.

13. The method, as recited in claim 1, wherein the deposition layer deposited over the protective walls is a barrier layer.

14. The method, as recited in claim 1, further comprising placing the substrate in an etch chamber, wherein the etching, the depositing the protective layer, and the stripping the patterned photoresist mask are done in situ within the etch chamber.

15. A method of forming a feature in a porous low-K dielectric layer over a substrate and disposed below a patterned photoresist mask, comprising:

etching a feature into the porous low-K dielectric layer through the photoresist mask;

depositing a protective layer over the feature after the etching the feature; and stripping the patterned photoresist mask, so that part of the protective layer is removed, where protective walls formed from the protective layer remain in the feature.

16. The method, as recited in claim 15, wherein the depositing the protective layer further comprises depositing a polymer layer.

* * * * *